(12) United States Patent
He et al.

(10) Patent No.: US 6,462,365 B1
(45) Date of Patent: Oct. 8, 2002

(54) ACTIVE PIXEL HAVING REDUCED DARK CURRENT IN A CMOS IMAGE SENSOR

(75) Inventors: Xinping He, San Jose, CA (US); Chih-huei Wu, Sunnyvale, CA (US); Tiemin Zhao, Palo Alto, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/011,589

(22) Filed: Nov. 6, 2001

(51) Int. Cl.[7] ............... H01L 31/062; H01L 31/113
(52) U.S. Cl. ............... 257/292; 257/396; 257/446; 257/461; 257/466
(58) Field of Search ................. 257/291, 292, 257/395, 396, 397, 446, 461, 462, 466

(56) References Cited

U.S. PATENT DOCUMENTS

| | | |
|---|---|---|
| 5,625,210 A | 4/1997 | Lee et al. |
| 6,040,592 A | 3/2000 | McDaniel et al. |
| 6,100,551 A * | 8/2000 | Lee et al. .............. 257/232 |
| 6,271,592 B1 | 8/2001 | Ballantine et al. |
| 6,278,145 B1 * | 8/2001 | Kato .............. 257/292 |
| 6,287,886 B1 * | 9/2001 | Pan .............. 438/57 |

* cited by examiner

*Primary Examiner*—Ngân V. Ngô
(74) *Attorney, Agent, or Firm*—Perkins Coie LLP

(57) ABSTRACT

The active pixel includes a photodiode, a transfer gate, and a reset transistor. The photodiode is substantially covered with an overlying structure, thus protecting the entire surface of the photodiode from damage. This substantially eliminates potential leakage current sources, which result in dark current. In one embodiment, the photodiode is covered by a FOX region in combination with the transfer gate.

24 Claims, 6 Drawing Sheets

ACTIVE PIXEL HAVING REDUCED DARK CURRENT IN A CMOS IMAGE SENSOR

TECHNICAL FIELD OF THE INVENTION

The present invention relates to image sensing devices, and more particularly, to a pixel cell having reduced dark current.

BACKGROUND OF THE INVENTION

CMOS image sensors have become the dominant solid state imaging technology, due in large part to their lower cost relative to CCD imaging devices. Further, for certain applications, CMOS devices are superior in performance. The pixel elements in a MOS device can be made smaller and therefore provide a higher resolution than CCD image sensors. In addition, signal processing logic can be integrated alongside the imaging circuitry, thus allowing for a single integrated chip to form a complete stand alone imaging device.

An active pixel sensor refers to an electronic image sensor with active devices, such as transistors, within each pixel. Conventional active pixel sensors typically employ photodiodes as the image sensing elements. The most popular active pixel sensor structure consists of three transistors and an N+/P-well photodiode, which is a structure that is compatible with the standard CMOS fabrication process. However, this design has the drawback of a relatively large dark current (i.e., the current that is output from the pixel in a dark environment).

It is desirable for the active pixel to have a low dark current. Excessive dark current lowers the dynamic range of the CMOS image sensor because there is insufficient ability to distinguish between light and dark conditions. In addition, dark current is the cause of the "white pixel" defect in CMOS image sensors, i.e., a pixel that always outputs a large signal.

Another active pixel sensor design that is not fabricated using the standard CMOS fabrication process is the pinned photodiode, as shown in U.S. Pat. No. 5,625,210. They pinned photodiode has gained favor for its ability to have good color response for blue light, as well as advantages in dark current density. Reduction in dark current is accomplished by pinning the diode surface potential to the P-well or P-substrate (GND) through a P+ region. Because of the pinning P+ region, a transfer gate is necessary to output the charge of the photodiode to a N+ output region. An improvement to the '210 patent is shown in U.S. Pat. No. 5,880,495, assigned to the assignee of the present invention.

Nevertheless, the pinned photodiode configuration of the '210 still has dark current effects. Further, the fabrication process for such a configuration requires significant modification form the standard CMOS fabrication prices, due to the buried channel transistor. The pinned photodiode configuration may cause image lag due to the incomplete transfer of charge from the diode to the floating node, if the junction profile is not perfectly optimized for the charge transfer.

Another approach in the context of CCD image sensors is to use a hydrogen anneal process to reduce dark current by passivating dangling silicon bonds. For example, U.S. Pat. No. 6,271,054 discloses using such a method. However, subsequent thermal processes, due to the poor thermal stability of the silicon-hydrogen structure, may easily destroy the effect of hydrogen passivation.

Still another approach, disclosed in our co-pending patent application filed Nov. 2, 2001 entitled "SURFACE PASSIVATION TO REDUCE DARK CURRENT IN A CMOS IMAGE SENSOR" to Wu et al., assigned to the assignee of the present invention, and incorporated by reference, teaches the use of nitrogen, silicon, hydrogen, or oxygen to passivate the dangling silicon bonds in a CMOS compatible process.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION OF THE PREFERRED EMBODIMENT

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is an active pixel sensor that can be formed with the standard CMOS fabrication process, while also having the desirable characteristics of a low dark current. The active pixel sensor includes a plurality of active pixels arranged in a two-dimensional array. The active pixels have substantially the entire surface of the photodiode covered either by a gate structure or a field oxide (FOX), thereby minimizing the amount of surface damage to the photodiode.

Figure 1:
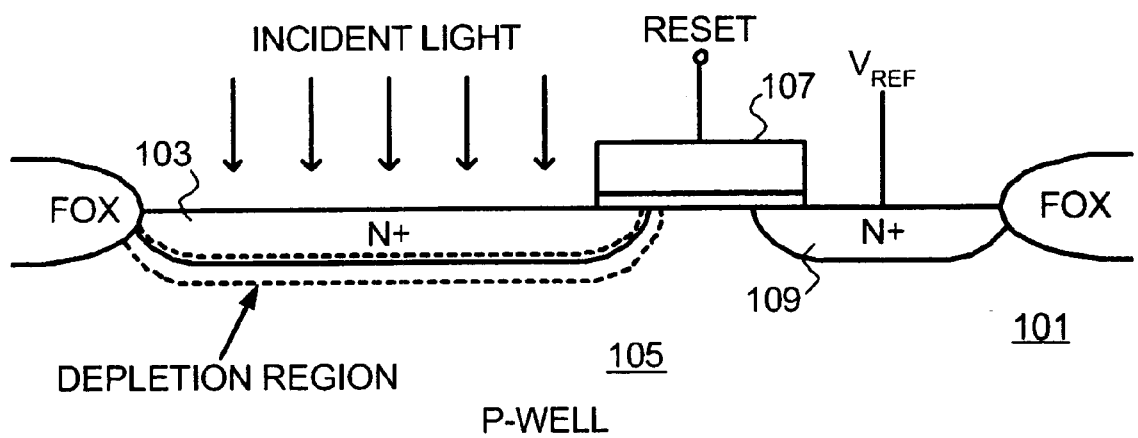
FIG. 1 shows a prior art active pixel.

Turning first to FIG. 1, a prior art conventional active pixel 101 is shown. The active pixel 101 includes a photodiode having a P-well 105 and a heavily doped N+ region 103 forming a p-n junction. The p-n junction is surrounded by an insulating oxide region, typically a FOX formed using a local oxidation of silicon (LOCOS) technique. Alternatively, the FOX may be a shallow trench isolation (STI).

The photodiode operates based on the principle of reverse-biasing a p-n junction diode such that a depletion region is formed. Next, the photodiode is subjected to incident light, which travels through transparent oxide layers and into the silicon. The properties of the semiconductor are such that electron-hole pairs are generated both inside and outside the depletion region in response to the incident photons of visible light. The photon generated electron-hole pairs are then swept away by diffusion and drift mechanisms and collected in the depletion region, thereby inducing a photocurrent representing a portion (one "pixel") of the desired image.

The current generated by the photodiode is used to modulate a pixel output transistor in source-follower configuration, as is conventional in the prior art. Further, note that a field effect transistor is formed by the N+ region 103, a reset gate 107, and a second N+ region 109. The reset gate 107 is conventionally formed from a stack of gate oxide and polysilicon. The second N+ region 109 is typically tied to a high voltage, such as $V_{REF}$. When the reset gate 107 is turned on, the photodiode is reset to the reset voltage ($V_{REF}$), as is also convention in the prior art. Unlike a pinned photodiode pixel, no transfer gate is used in this prior art pixel design.

As noted previously, it has been found that the active pixel 101 of FIG. 1 is susceptible to dark current, which may manifest as white pixels in the image. One source of dark current is due to surface damage to the photodiode. The surface damage is in the form of dangling silicon bonds and is often caused by manufacturing process related defects, including gate and spacer etching stress. Another source of dark current comes from the FOX edge, which may result in mechanical stress or concentrated electrical field at the edge.

Figure 2:
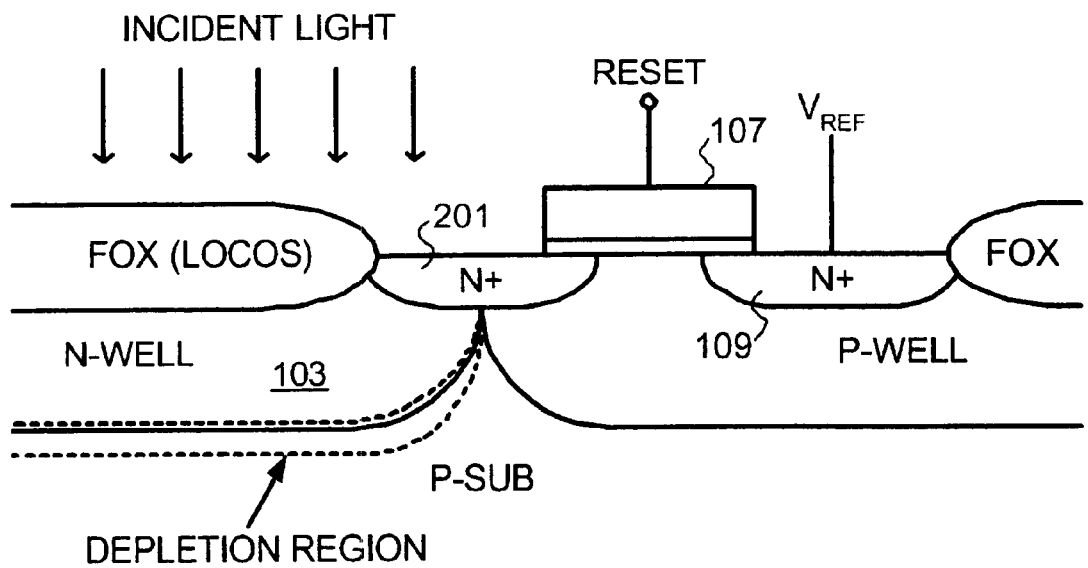
FIGS. 2 and 3 are additional prior art active pixels.
Figure 3:
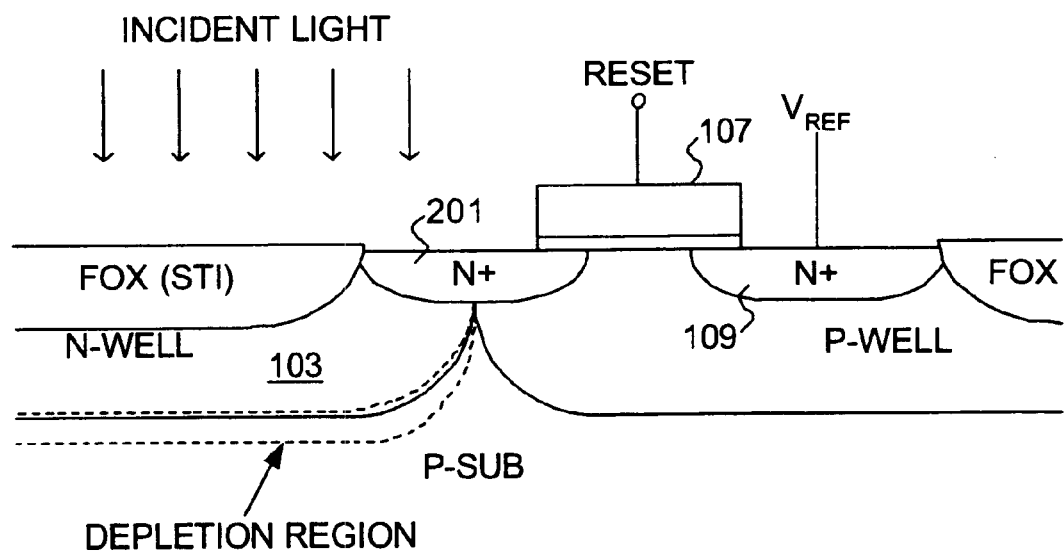

A prior art attempt to reduce dark current is shown in FIGS. 2 and 3. Note that FIGS. 2 and 3 are substantially identical except that FIG. 2 shows LOCOS isolation and FIG. 3 shows a STI. In this prior art, the photodiode is formed beneath the isolation in the hopes of protecting the photodiode from surface damage and minimize leakage current. However, the use of the N+ region 201 to connect to output circuitry is still a potential leakage source susceptible to process induced damage. The active pixel of the present invention includes a transfer gate, as well as a reset transistor. However, unlike the prior art, the entire photodiode is substantially covered with an overlying structure, thus protecting the entire surface of the photodiode from damage. This substantially eliminates the potential leakage sources. In one embodiment, the photodiode is covered by a FOX region in combination with the transfer gate. The invention shown in FIG. 4–5 can significantly reduce surface damage, as well as relieve mechanical stress at the FOX edge. As a result, the dark current can be reduced, thus, minimizing the number of white pixels.

Figure 4:
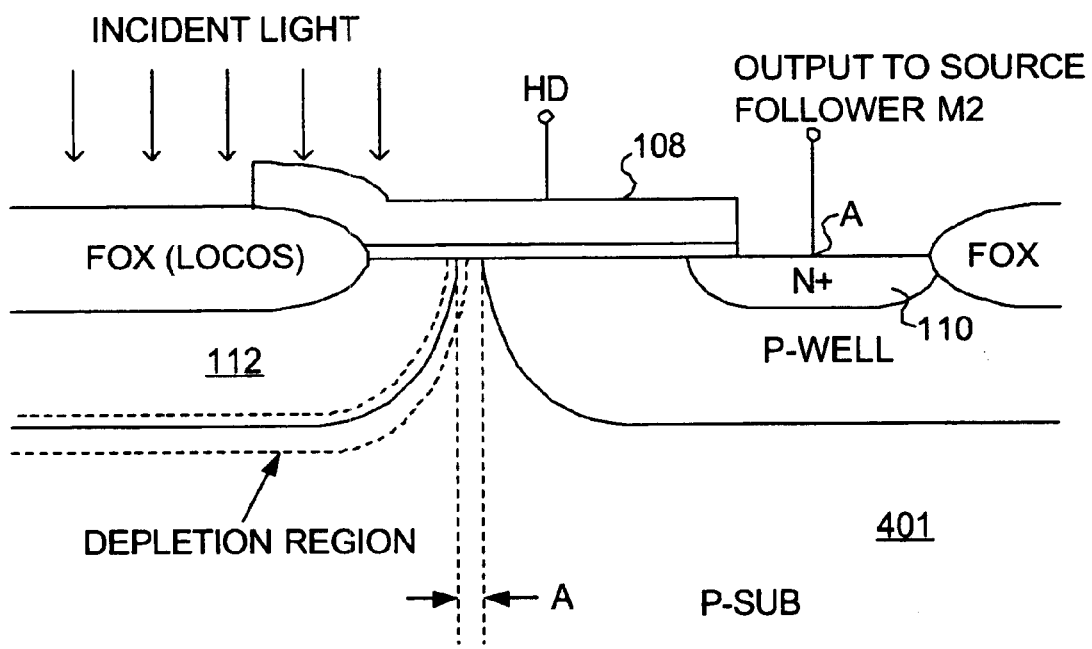
FIGS. 4 and 5 are active pixels formed in accordance with the present invention.
Figure 5:
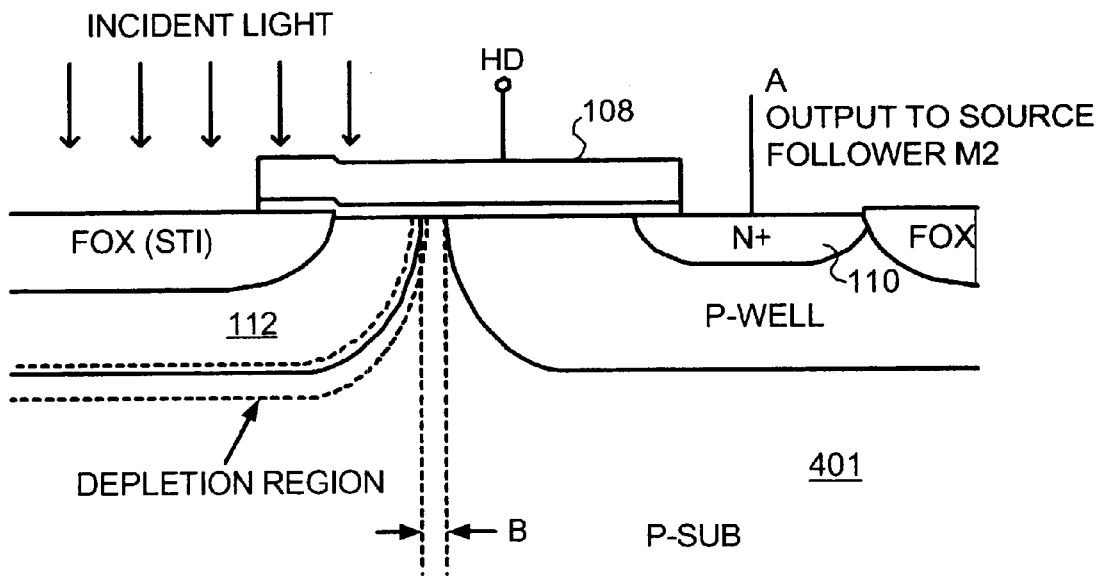
Figure 6:
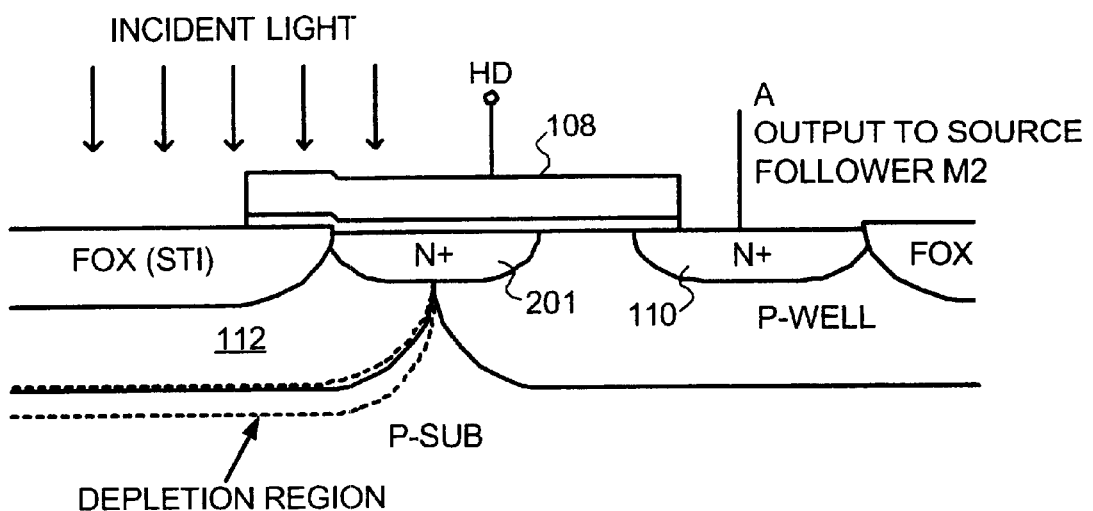
FIG. 6 is an active pixel formed in accordance with an alternative embodiment of the present invention.
Figure 7:
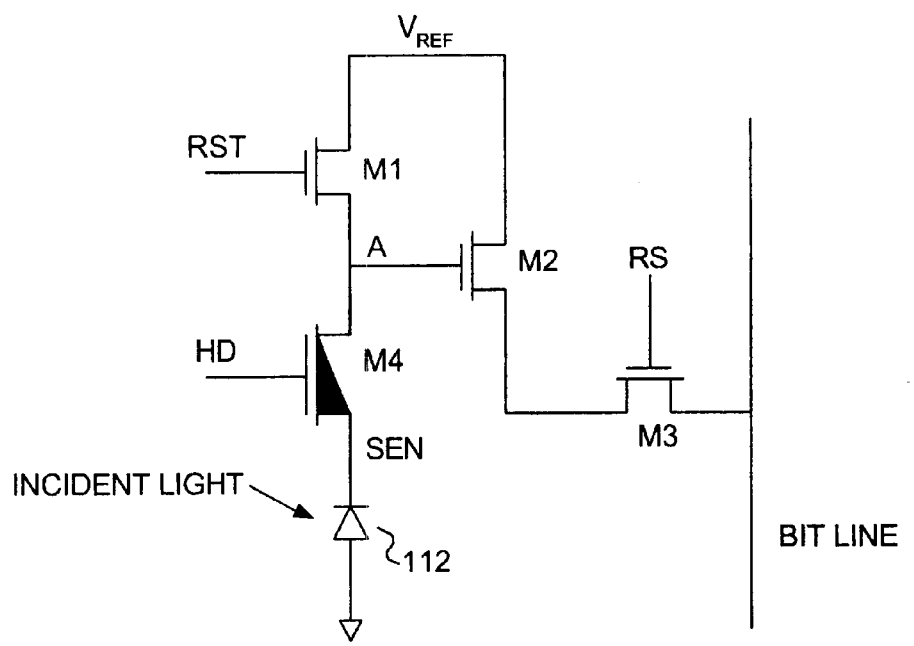
FIGS. 7 and 8 are schematic diagrams of the active pixel formed in accordance with the present invention.
Figure 8:
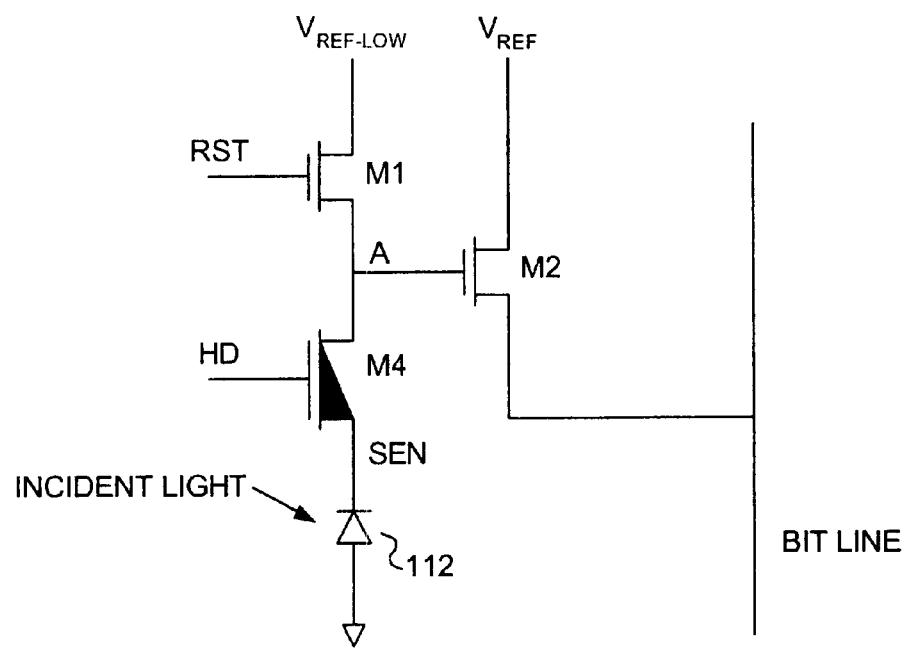
Figure 9:
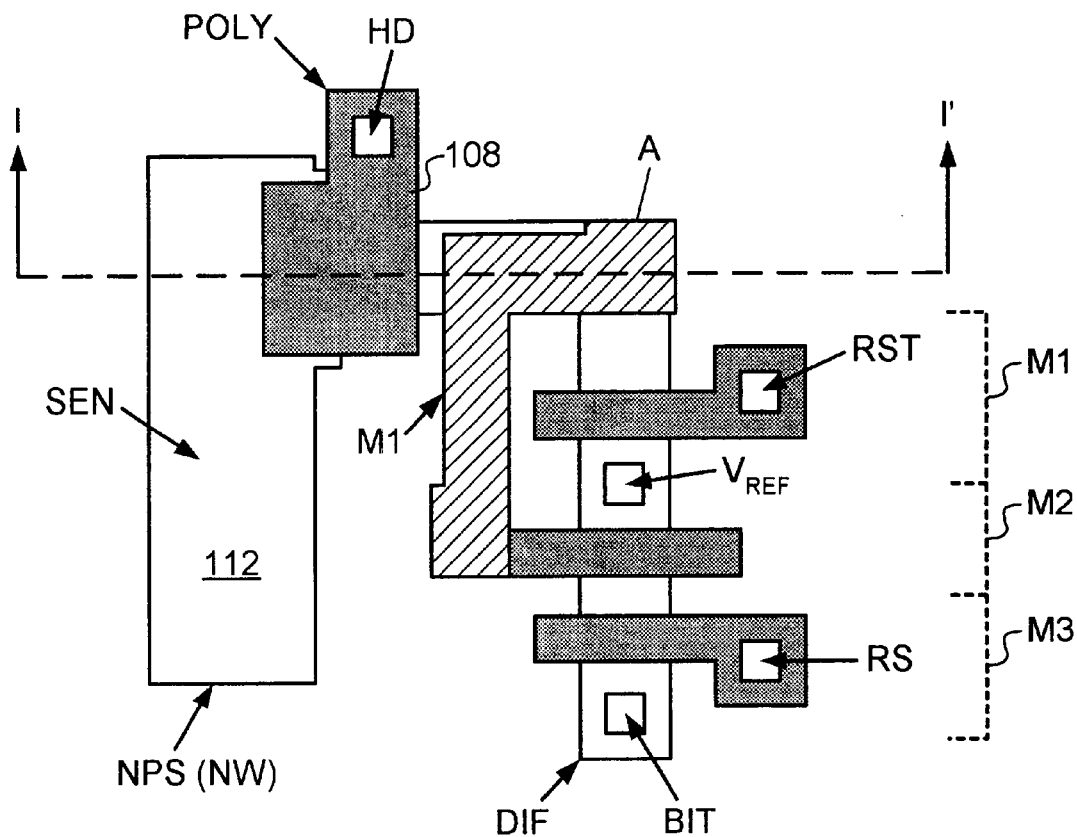
FIG. 9 shows a top layout view of the active pixel of the present invention.

Specifically, turning to FIGS. 4 and 5, an active pixel 401 formed in accordance with the present invention is shown. FIGS. 4 and 5 are substantially similar, except that FIG. 4 shows a LOCOS isolation and FIG. 5 shows a STI structure. Further, FIG. 9 shows a top layout view of the active pixel 401 and FIGS. 7 and 8 show the active pixel 401 in schematic form. As will be further described below, FIG. 6 is an alternative embodiment of the active pixel 401. FIGS. 4 and 5 are cross section views taken along line 1–1 ' of FIG. 9.

As seen in FIGS. 4–9, a transfer gate 108 is formed between an output node A (formed by an N+ region 110) and extending to at least the FOX region. The transfer gate 108 is in one embodiment formed from a stack of gate oxide and polysilicon. However, it can be appreciated that the transfer gate 108 may also be formed from other combinations of materials or only one material. The transfer gate is controlled by signal HD.

Further, the transfer gate 108 is sized and shaped to cover substantially all of the photodiode 112 not already covered by the FOX region. Note that in FIG. 9, the FOX region covers substantially all of the region, except for the diffusion (DIF). Like the active pixels shown in FIGS. 2 and 3, a large portion of the photodiode 112 is formed underneath the FOX region. This minimizes the possibility of damage to the surface of the photodiode 112.

However, unlike the prior art, an overlying structure is used to cover the remainder of the photodiode 112. Thus, the transfer gate 108 is extended to cover the remainder of the active area (between the FOX region and the N+ region 110). While the transfer gate 108 is shown to extend well over the FOX region, it can be appreciated that the extent of the overlap (if any) is variable and dependent upon process limitations and design rules. Indeed, in one embodiment, the transfer gate 108 extends to just the edge of the FOX region.

Note that in some embodiments, there may be a space between the photodiode 112 and the P-well. This space is shown as dimension A in FIG. 4 and dimension B in FIG. 5. In other embodiments, the spacing may be zero. In order to collect photo-generated charge, it is necessary to effectively separate the photo-generated electron-hole (e-h) pairs to minimize recombination. Further, it is necessary to cause the carriers to reach a collection contact. Both of these objectives can be met using a built-in electric field (such as a p-n junction) or by an externally applied field. It is desirable to have the e-h pair generation and the electric field occur at the same location, so that generation and collection can occur more effectively, e.g. increase the quantum efficiency (QE). This is the principle of operation of the present pixel.

Note that the doping concentration in the P-sub region is significantly lower than the doping concentration in the P-well area. The gap (A or B) between the N-well 112 and the P-well can increase the depletion area and that will increase the QE. However, the size of the gap depends on process and design rules, and in some cases, it may not be possible to have a gap.

Node A also serves as the output of the photodiode 112. When the transfer gate 108 is activated by the signal HD, the charge developed in the photodiode 112 is shared with node A. This charge is then used to modulate the output of a pixel output transistor (shown as M2 in FIGS. 7 and 8) in source-follower configuration.

Further, in an alternative embodiment shown in FIG. 6, a surface N+ region 201 may also be formed between the photodiode 112 and the P-well. The surface N+ region 201 is used to aid in the charge transfer from the photodiode.

As best seen in the top layout view of FIG. 9, the active pixel 401 also includes a reset transistor M1 (controlled by a RST signal), a row select transistor M3 (controlled by a RS signal), and the pixel output transistor (controlled by the signal on node A) M2. Note that in FIGS. 7 and 8 the transfer gate 108 is denoted as a transistor like device M4 controlled by signal HID.

FIG. 8 is an alternative embodiment that eliminates the row select transistor M3 (controlled by RS) because the existence of M4. In this embodiment, the idea is to apply a different lower voltage ($V_{REF-LOW}$) to the reset transistor M1 when the pixel is not selected (the RST signal should be high at that time so M1 in on). The voltage ($V_{REF-LOW}$) is low enough such that the output transistor M2 is off. In other words, M2 is used as a voltage buffer (source follower) when the pixel is selected and M2 is on at that time. M2 is off when the pixel is not selected and acts as a row select transistor.

Thus, the primary aspect of the present invention is that substantially all of the photodiode surface area is covered and protected. In one embodiment, the photodiode 112 is covered by either the FOX region or the transfer gate 108. Because of this, the amount of dark current resulting from process induced surface damage or mechanical stress of FOX edge is reduced significantly.

Note that the present invention teaches the use of a transfer gate 108 (M4) between the photodiode 112 and the reset transistor M1. This allows any dark current to be reset before readout, and as a result, dark current can be further reduced.

Thus, output node A is reset before the signal charge is transferred from the photodiode. This can be accomplished either by applying a voltage constantly to node A (more suitable for the circuit in FIG. 8) or by applying a reset operation (by activating the reset transistor M1) before transfer of the signal charge (more suitable for the circuit in FIG. 7). The present invention "pushes" the major dark current to output node A, therefore, it is necessary to reset the dark current before transfer of the signal charge from the photodiode.

Figure 10:
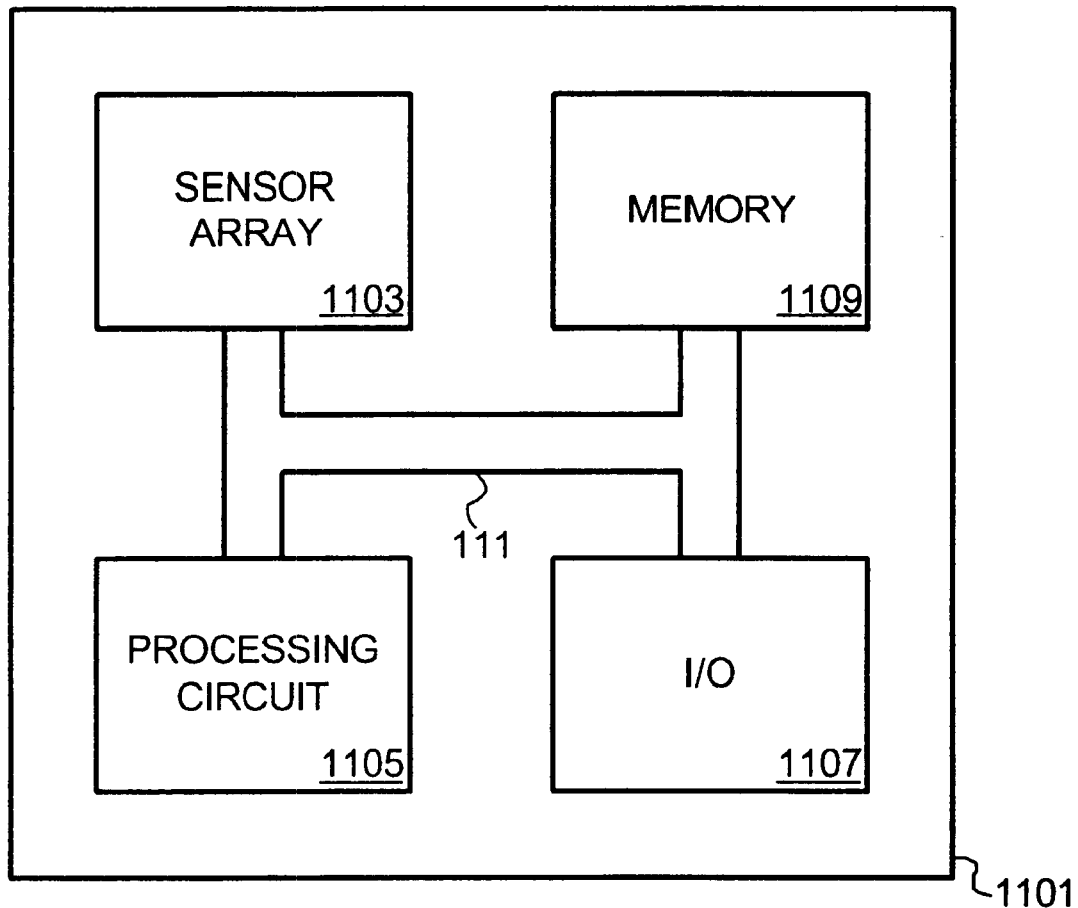
FIG. 10 shows an image sensor formed using the active pixels of the present invention.

The active pixels described above may be used in a sensor array of a CMOS image sensor 1101. Specifically, FIG. 10 shows a CMOS image sensor formed in accordance with the present invention. The CMOS image sensor includes a sensor array 1103, a processor circuit 1105, an input/output (I/O) 1107, memory 1109, and bus 1111. Preferably, each of these components is formed on a single silicon substrate and manufactured to be integrated onto a single chip using standard CMOS processes.

The sensor array 1103 portion may be, for example, substantially similar to the sensor arrays portions of image sensors manufactured by the assignee of the present invention, OmniVision Technologies, Inc., of Sunnyvale, Calif., as model numbers OV7630, OV7920, OV7930, OV9620, OV9630, OV6910, or OV7640, except that the pixels are replaced with the active pixels disclosed herein.

More specifically, the sensor array 1103 includes a plurality of individual pixels arranged in a two-dimensional array. In operation, as an image is focused onto the sensor array 1103, the sensor array 1103 can obtain the raw image data.

The raw image data is then received by the processor circuit 1105 via bus 1111 to begin signal processing. The processor circuit 1105 is capable of executing a set of preprogrammed instructions (perhaps stored in memory 1107) necessary to carry out the functions of the integrated circuit 1101. The processor circuit 1105 may be a conventional microprocessor, DSP, FPGA or a neuron circuit.

While the preferred embodiment of the invention has been illustrated and described, it will be appreciated that various changed can be made therein without departing from the spirit and scope of the invention. It is also understood where the device has generally been shown using different types of P or N type materials, the types of materials could be switched to produce similar results. For example, rather than the N-well/P-sub photodiode that was formed, the alternate types of materials could be used to form a P-well/N-sub photodiode. Thus, photodiodes that are N+/P-well, N+/P-sub, N-well/P-sub, P+/N-well, P-well/N-sub, etc. . . . may also be used. Thus, the term PN photodiode is defined to include all types of photodiodes. Further, an additional implant to adjust the threshold voltages ($V_t$) of the transfer or reset transistor may be performed to optimize charge transfer from the photodiode.

Thus, the present invention has been described in relation to a preferred and several alternate embodiments. One of ordinary skill after reading the foregoing specification will be able to affect various changes, alterations, and substitutions of equivalents without departing from the broad concepts disclosed. It is therefore intended that the scope of the letters patent granted hereon be limited only by the definitions contained in appended claims and equivalents thereof, and not by limitations of the embodiments described herein.

We claim:

1. An active pixel formed in a semiconductor substrate comprising:
    a field oxide (FOX) region formed on said substrate defining an active area;
    a photodiode formed in said semiconductor substrate, a first portion of said photodiode being formed underneath said FOX region;
    an output node formed within said active area and adjacent to said photodiode; and
    a transfer gate formed over said substrate and between said output node and said photodiode, further wherein said transfer gate is formed on top of a second portion of said photodiode, such that substantially the entire surface of the photodiode is covered by either the transfer gate or the FOX region.

2. The active pixel of claim 1 further including a reset transistor formed within said active area, said reset transistor having a gate formed between said output node and a voltage reference ($V_{REF}$).

3. The active pixel of claim 1 wherein said FOX region is formed from local oxidation of silicon.

4. The active pixel of claim 1 wherein said FOX region is formed by shallow trench isolation.

5. The active pixel of claim 1 wherein said substrate is a P-type substrate and said output node is a N+ region.

6. The active pixel of claim 1 wherein said output node is formed within a P-well formed in said P-type substrate.

7. The active pixel of claim 6 wherein said P-well is separated from said photodiode by a gap.

8. The active pixel of claim 6 wherein said photodiode is formed by an N-well formed in said P-type substrate.

9. The active pixel of claim 1 further including a surface N+ region underneath said transfer gate and adjoining said photodiode.

10. The active pixel of claim 1 farther including a pixel output transistor formed within said active area and having its gate connected to said output node.

11. The active pixel of claim 10 further including a row select transistor formed within said active area and connected to the drain of said pixel output transistor.

12. A pixel formed in a substrate for use in a CMOS image sensor comprising:
    a photodiode formed from the junction of a first top portion of said substrate having a first conductivity type and a second bottom portion of said substrate having a second conductivity type, the first top portion being substantially covered by a field oxide (FOX) region;
    an output node formed in said substrate;
    a transfer gate formed on said substrate between said output node and said photodiode, said transfer gate in combination with said FOX region covering substantially all of said first top portion;

a reset transistor coupled between said output node and a voltage reference ($V_{REF}$) for resetting the output node; and a pixel output transistor having its gate coupled to the output node.

13. The pixel of claim 12 wherein said FOX region is formed from local oxidation of silicon.

14. The pixel of claim 12 wherein said FOX region is formed by shallow trench isolation.

15. A CMOS image sensor comprising:

a plurality of active pixels arranged in rows and columns, at least one of said active pixels comprising:
  (a) a field oxide (FOX) region formed on said substrate defining an active area;
  (b) a photodiode formed in said semiconductor substrate, a first portion of said photodiode being formed underneath said FOX region;
  (c) an output node formed within said active area and adjacent to said photodiode; and
  (d) a transfer gate formed over said substrate and between said output node and said photodiode, further wherein said transfer gate is formed on top of a second portion of said photodiode, such that substantially the entire surface of the photodiode is covered by either the transfer gate or the FOX region;

a processing circuit for receiving the output of said active pixels; and an I/O circuit for outputting the output of said active pixels off of said CMOS image sensor.

16. The image sensor of claim 15 further said active pixel further includes a reset transistor formed within said active area, said reset transistor having a gate formed between said output node and a voltage reference ($V_{REF}$).

17. The image sensor of claim 15 wherein said FOX region is formed from local oxidation of silicon.

18. The image sensor of claim 15 wherein said FOX region is formed by shallow trench isolation.

19. The image sensor of claim 15 wherein said substrate is a P-type substrate and said output node is a N+ region.

20. The image sensor of claim 15 wherein said output node is formed within a P-well formed in said P-type substrate.

21. The image sensor of claim 20 wherein said photodiode is formed by an N-well formed in said P-type substrate.

22. The image sensor of claim 15 wherein said active pixel further includes a surface N+ region underneath said transfer gate and adjoining said photodiode.

23. The image sensor of claim 15 wherein said active pixel further includes a pixel output transistor formed within said active area and having its gate connected to said output node.

24. The image sensor of claim 23 wherein said active pixel further includes a row select transistor formed within said active area and connected to the drain of said pixel output transistor.

* * * * *

UNITED STATES PATENT AND TRADEMARK OFFICE
CERTIFICATE OF CORRECTION

PATENT NO.   : 6,462,365 B1
DATED        : October 8, 2002
INVENTOR(S)  : He et al.

It is certified that error appears in the above-identified patent and that said Letters Patent is hereby corrected as shown below:

Column 1,
Line 39, "They" should be -- The --;

Column 6,
Line 50, "farther" should be -- further --;

Signed and Sealed this

Eighteenth Day of February, 2003

JAMES E. ROGAN
*Director of the United States Patent and Trademark Office*